United States Patent [19]
Culnane et al.

[11] Patent Number: 5,744,863
[45] Date of Patent: Apr. 28, 1998

[54] CHIP CARRIER MODULES WITH HEAT SINKS ATTACHED BY FLEXIBLE-EPOXY

[75] Inventors: Thomas Moran Culnane, Lanesboro, Pa.; Michael Anthony Gaynes, Vestal, N.Y.; Ping Kwong Seto, Endicott, N.Y.; Hussain Shaukatullah, Endwell, N.Y.

[73] Assignee: International Business Machines Corporation, Armonk, N.Y.

[21] Appl. No.: 474,341

[22] Filed: Jun. 7, 1995

Related U.S. Application Data

[62] Division of Ser. No. 273,253, Jul. 11, 1994, abandoned.

[51] Int. Cl.⁶ .................... H01L 23/34; H05K 7/20
[52] U.S. Cl. .................. 257/712; 257/713; 257/717; 257/704; 257/705; 361/704; 361/705; 361/712; 361/751
[58] Field of Search .................. 257/712, 713, 257/717, 718, 720, 796, 705, 778, 706, 769; 361/704, 705, 712, 751

[56] References Cited

U.S. PATENT DOCUMENTS

| | | |
|---|---|---|
| 3,458,925 | 8/1969 | Napier et al. . |
| 4,000,509 | 12/1976 | Jarvela . |
| 4,092,697 | 5/1978 | Spaight . |
| 4,604,644 | 8/1986 | Beckham et al. . |
| 4,701,482 | 10/1987 | Itoh et al. . |
| 4,742,024 | 5/1988 | Sugimoto et al. . |
| 4,825,284 | 4/1989 | Soga et al. .................. 257/778 |
| 4,878,108 | 10/1989 | Phelps, Jr. et al. .................. 257/718 |
| 4,914,551 | 4/1990 | Anschel et al. . |
| 5,041,902 | 8/1991 | McShane . |
| 5,097,318 | 3/1992 | Tanaka et al. . |
| 5,121,190 | 6/1992 | Hsiao et al. . |
| 5,147,084 | 9/1992 | Behun et al. . |
| 5,159,535 | 10/1992 | Desai et al. . |
| 5,168,430 | 12/1992 | Nitsch et al. . |
| 5,198,693 | 3/1993 | Imken et al. .................. 257/707 |
| 5,235,347 | 8/1993 | Lee .................. 346/107 R |
| 5,251,100 | 10/1993 | Fujita et al. . |
| 5,262,927 | 11/1993 | Chia et al. .................. 361/717 |
| 5,291,064 | 3/1994 | Kurokawa . |
| 5,367,196 | 11/1994 | Mahulikar et al. . |
| 5,375,320 | 12/1994 | Kinsman et al. . |
| 5,455,457 | 10/1995 | Kurokawa .................. 257/712 |
| 5,461,257 | 10/1995 | Hundt .................. 257/707 |

FOREIGN PATENT DOCUMENTS

| | | |
|---|---|---|
| 1029158 | 2/1986 | Japan . |
| 2136865 | 6/1987 | Japan . |
| 1217951 | 8/1989 | Japan . |
| 3012955 | 1/1991 | Japan . |

OTHER PUBLICATIONS

Technical Data Sheet—Ablebond P1-8971, "Low Stress Die Attach Adhesive". no date.
Technical Data Sheet—Experimental Product XP-080792-3, "Low Stress Heat Sink Attach". no date.
IBM Technical Disclosure Bulletin, vol. 21, No. 4A, Sep., 1989, "Removal of Heat From Direct Chip Attach Circuitry", pp. 346-348, by Schrottke et al.

*Primary Examiner*—Carl W. Whitehead
*Attorney, Agent, or Firm*—Whitham, Curtis, Whitham & McGinn

[57] ABSTRACT

An aluminum or copper heat sink is attached to a ceramic cap or exposed semiconductor chip using flexible-epoxy to provide improved thermal performance. The aluminum may be coated by anodizing or chromate conversion or the copper may be coated with nickel. Such structures are especially useful for CQFP, CBGA, CCGA, CPGA, TBGA, PBGA, DCAM, MCM-L, single layer ceramic, and other chip carrier packages as well as for flip chip attachment to flexible or rigid organic circuit boards. These adhesive materials withstand thermal cycle tests of 0° to 100° C. for 1,500 cycles, −25° to 125° C. for 400 cycles, and −40° to 140° C. for 300 cycles; and withstand continuous exposure at 130° C. for 1000 hours without loss of strength. Flexible-epoxies have a modulus of elasticity below 100,000 psi and a glass transition temperature below 25° C., are much stronger than typical silicone adhesives, and do not contaminate the module or circuit board with silicone. The flexible epoxy may contain a material having a low coefficient of thermal expansion (CTE) in order to provide a CTE between that of the silicon die and the metal of the heat sink.

34 Claims, 7 Drawing Sheets

CHIP CARRIER MODULES WITH HEAT SINKS ATTACHED BY FLEXIBLE-EPOXY

This is a divisional of application(s) Ser. No. 08/273,253 filed on Jul. 11, 1994 now abandoned.

TECHNICAL FIELD OF INVENTION

These inventions relate to the field of heat spreaders and heat sinks for electronic components and the process of attaching such heat spreaders and heat sinks to such components.

BACKGROUND OF THE FIELD

This section Is included for the purpose of incorporating citations by reference and is not intended to and does not make any admissions regarding prior art.

Flip-chips have been thermally connected to heat spreaders using thermal grease as described in U.S. Pat. No. 4,000,509 to Jarvela. Typically a heat spreader such as a cap, heat spreader plate, finned heat spreader, or liquid cored cold plate is mechanically connected to a chip carrier module or a circuit board so as to leave a thin gap between a flip-chip attached to the module or board and one surface of the heat spreader. This gap is filled with the thermal grease such as a silicone grease which may be filled with a highly thermally conductive material such as silver or ceramic material such as alumina to provide a high quality thermally conductive path between the chip and heat spreader.

Epoxies have been used to attach semiconductor chips to certain substrates. In U.S. Pat. No. 5,159,535 to Desai, epoxy is used to connect the back of a semiconductor computer chip to a copper clad Invar (Cu-Invar-Cu) interposer which has a coefficient of thermal expansion (CTE) between that of a semiconductor and a glass fiber epoxy circuit board to which the interposer is attached by soldering. Alternatively, in Desai, if the circuit board is made of a material (e.g. INVAR) with a CTE that closely matches that of a semiconductor chip, the chip may be directly attached to the board using thermally conductive epoxy. Similarly, U.S. Pat. No. 4,914,551 to Anschel discloses attaching a semiconductor chip to a heat spreader of silicon carbide (SiC), aluminum nitride (AlN), or Cu-Invar-Cu using epoxy filled with diamond particles so that CTEs differ by no more than two parts per million per degree Centigrade (ppm/° C.). The CTE in ppm/° C. of Si is 2.6, of SiC 2.6, of AlN 4.6, of Invar 2, of Cu-Invar-Cu 3–6, of epoxy 50–80, of fiberglass-epoxy 11–18, and of epoxy filled with fused quarts 5–7. *Removal of Heat From Direct Chip Attach Circuitry* by G. Schrottke and D. J. Willson in *IBM Technical Disclosure Bulletin* Volumn 32 Number 4A September, 1989, discloses using adhesive to bond silicon chips to a Cu-Invar-Cu heat spreader. U.S. Pat. No. 5,168,430 to Nitsch in FIG. 2 shows a hybrid circuit structure 3 cemented to a heat spreader 4. European Patent Application 93104433.3 to Bennett discloses a semiconductor die attached to a lead frame using conductive epoxy.

Epoxies have been used to encapsulate flip-chip connections as described in U.S. Pat. No. 4,604,644 to Beckham and U.S. Pat. Nos. 4,999,699 and 5,089,440 to Christie, in order to reduce stresses in the C4 (controlled collapse chip connection) joints. C4 joints are described in U.S. Pat. No. 3,458,925. Epoxies for such purposes are well known as described in U.S. Pat. No. 4,701,482 to Itoh. Such epoxies typically have a glass transition temperature (Tg) of about 140°–150° C., and a modulus of around 1,000,000 psi or more. Epoxies have been used for transfer molding and injection molding to produce components such as QFPs (quad flat packs), DIPs (dual-in-line packages) and other plastic packages. Ceramic chip carrier packages such as ceramic quad flat packs are typically two ceramic parts connected together with epoxy. ECA (electrically conductive adhesive) chip attachments may be encapsulated with epoxy or more preferrably by a thermoplastic.

Heat spreaders such as Aluminum (Al) which may be coated by chromate conversion or anodized, or copper (Cu) which may be coated by nickle (Ni), are bonded to plastic packages using epoxy. The CTE in ppm/° C. of Al is 23 and of Cu is 17. For higher temperature applications, ceramic chip packages are used and silicone adhesives are used to bond a heat spreader to the top of the module or the heat spreader is mechanically attached by: screws or by clipping. A "technical data sheet for Ablebond P1-897 of September 1993 recommends attaching a large die to a silver coated copper lead frame using this material. A product data sheet for Prima-Bond TM EG 7655 recommends using the material "for bonding materials with highly mismatched CTEs (i.e., Alumina to Aluminum, Silocon to Copper, etc.)

These inventions are applicable to ceramic top modules such as CQFPs (ceramic QFPs) and to flip-chip carrier modules such as: capless CQFPs; TBGA (TAB ball grid array), TAB (tape automated bonding) modules as described by Desai and in U.S. Pat. No. 4,681,654 to Clementi, and 5,203,075 to Flynn; CBGA (ceramic ball grid array) modules described by Behum, and in Ser. No. 08/144,981 by Hoebner; DCAM (direct chip attach modules) described in Ser. No. 08/178,994 by White; and well known CPGA (ceramic pin grid array) modules.

All the above citations are incorporated herein by reference to provide an enabling disclosure and to support the claims to which the applicant is entitled by law.

OBJECTIVES OF THE INVENTION

It is an object of the invention to improve the thermal efficiency for removing heat from a flip-chip to increase reliability and potentially increase power dissipation to allow a higher device density.

It is another object of the invention to provide a new use for known epoxies.

It is another object of the invention to provide an improved electronic package that can dissipate more heat from high thermal density computer chips than previously possible.

Finally it is an object of the invention to provide a computer system with fewer chips of higher density and faster operation than has previously been practice.

SUMMARY OF THE INVENTION

These objects are accomplished in the invention by bonding an aluminum or copper heat spreader or heat spreader plate directly to the back side of a semiconductor flip-chip or a ceramic QFP. The applicants have discovered that a thin layer of a highly flexible-epoxy that has a glass transition temperatures below room temperature can be used to bond the heat spreader directly to the back of a flip-chip or ceramic cap and the bond will remain strong even after thermal cycle testing of 0° to 100° C. for 1500 cycles, –25° to 125° C. for 400 cycles, and –40° to 140° C. for 300 cycles; or after continuous exposure to 130 degrees C for 1000 hours.

ENABLING DESCRIPTION OF PREFERRED EMBODIMENTS

Typical epoxies have a Tg of about 140–150 degrees C, but flexible-epoxies used in these inventions have a Tg below about 250, preferably below 10° C. and more preferably below 0° C. Also, typical epoxies have a Young's modulus of around 1,000,000 psi, but flexible-epoxies used in these inventions have a Young's modulus below about 100,000 psi, preferably below 50,000 psi, and even more preferably below 20,000 psi. A two part flexible-epoxy named EG 7655, is available from AI Technologies Inc. 9 Princess Rd. Lawrencevill, N.J. 08648 and has a Tg of about −25° C. and a Young's modulus less than about 20,000 psi. A one part flexible-epoxy named ABLEBOND ®P1-8971 is distributed by Ablestick Laboratories 20021 Susana Road Rancho Dominguez, Calif. 90221. and has a Tg of about 5° C. and a Young's modules of less than about 50,000 psi.

Figure 1:
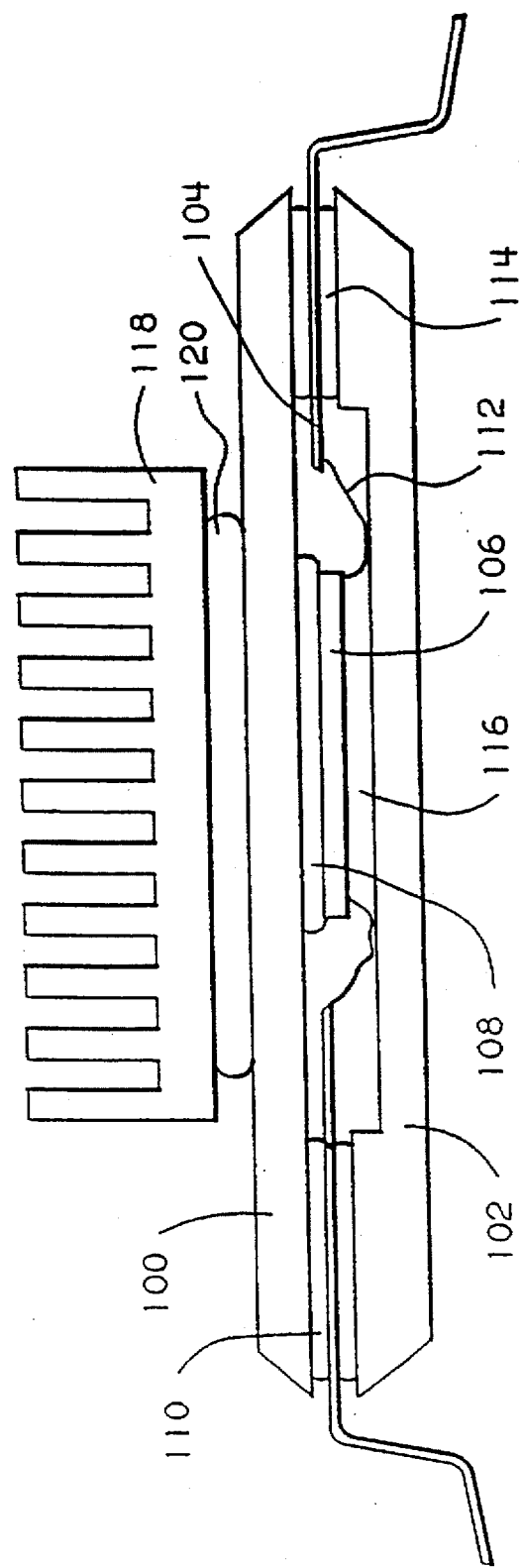
FIG. 1 shows an aluminum heat spreader bonded by flexible-epoxy to a CQFP to illustrate an embodiment of the invention.

In FIG. 1, the CQFP module is produced from two preformed, fired halves 100, 102 of ceramic (preferably Al—N). Semiconductor chip 106 (preferably silicon) is bonded to top half 100 of the flat pack using for example a typical die attach epoxy 108, and the chip is wire bonded 112 to the lead frame. Then top half 100 is bonded to bottom half 102 using for example a typical epoxy 110, 114. Cavity 116 is typically empty but may contain an electrically non-conductive, thermally conductive thermal substance (e.g. silicon grease). Then an Al heat spreader 118 (preferably coated by anodization or more preferably by Chromate conversion) is attached to the top of the ceramic module using a thin layer of flexible-epoxy 120.

The CTE of Al—N is about 4.6 ppm/° C., and the CTE of the Al of the heat spreader is about 23.6 ppm/° C., which results in a CTE difference of 19 ppm/° C. The ceramic top is a relatively smooth surface and any de-lamination or cracking of the epoxy between the package and heat spreader causes a critical reduction in heat transfer from the chip. When this structure is subjected to thermal cycling common epoxies quickly fail (de-laminate). Silicone based adhesives have Tg's below 25° C. and Young's Moduli below 20,000 pse. However, mechanically, the bonds are about one third to one half the strength of a flexible epoxy. Also, constituents of silicon adhesives have a tendency to migrate out contaminating surfaces with a thin coating. The applicants have discovered that flexible-epoxies (e.g. ABLEBOND P1-8971 and EG 7655) meet the thermal cycling requirements of this test.

Alternately, cap 102 may be replaced by epoxy encapsulant (gob top) to protect the wire bond chip. The epoxy may just cover the chip and wire bonds or it may extend to the circuit board on which the module is mounted. Also, an organic material such as fiberglass-epoxy or a laminate of copper and polyimide foils may be substituted for the ceramic of the top half 100.

Figure 2:
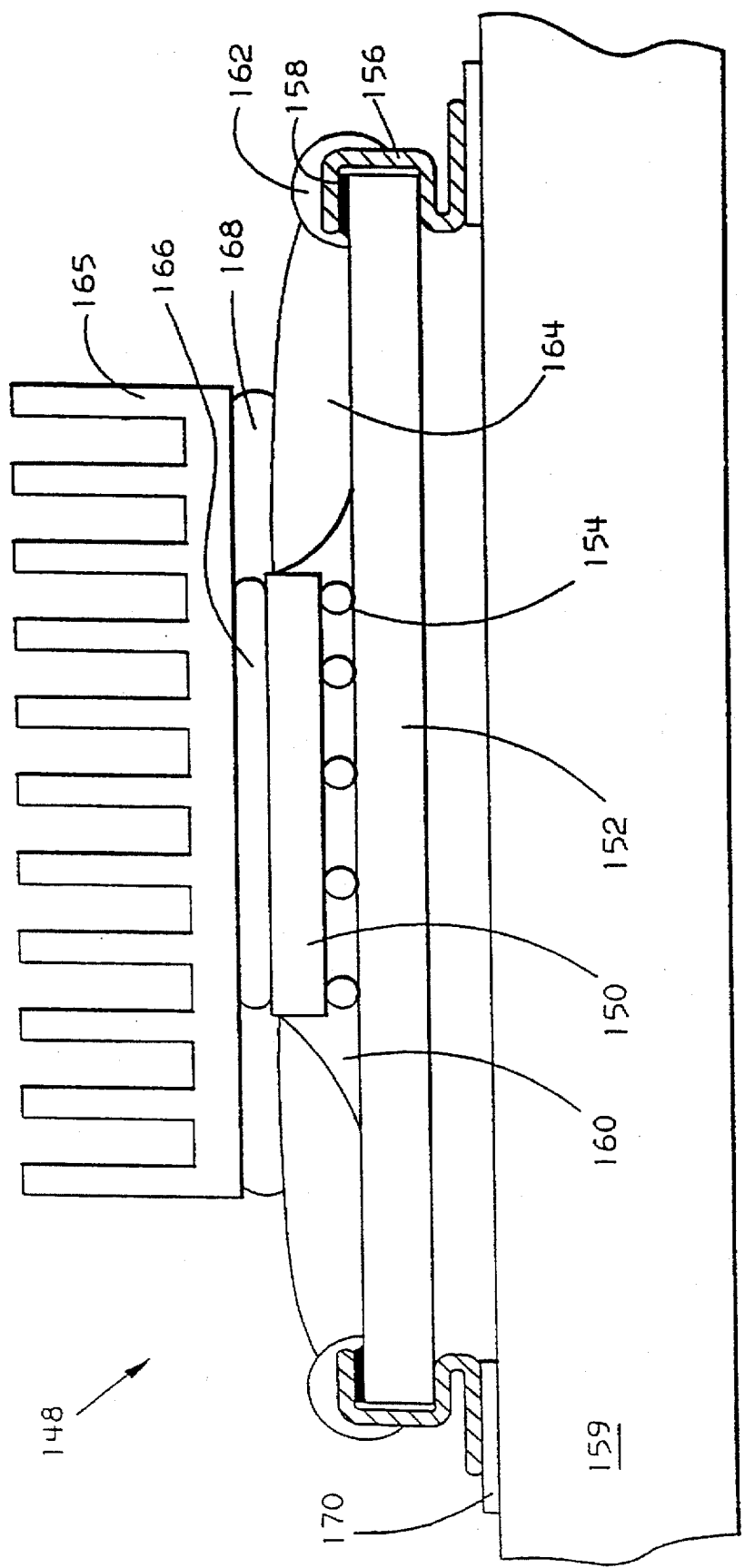
FIG. 2 shows an aluminum heat spreader bonded by flexible-epoxy to a semiconductor flip-chip on a capless CQFP to illustrate another embodiment of the invention.

FIG. 2 shows another CQFP 148 which does not have a top half. The front side (bottom) of a semiconductor flip-chip die 150 is attached to a single layer rectangular ceramic chip carrier 152 by perimeter row or a grid array of C4 joints 154 that extend from conductive contacts on the chip to conductive contacts on the carrier. Alternativly, the chip bumps could be attached to the contacts on the carrier by eutectic solder bumps deposited by plating, solder inject, or transfer from a decal. Leads such as gullwing leads 156 are soldered 158 to copper pads along edges (typically all four edges for QFPs) for surface mount connection to substrate 156. Alternately the bottom end of the leads may bend under the module in a J or even pointed straight down. The joints 154 are encapsulated with epoxy 160 and preferably the leads are encapsulated with epoxy 162. Preferably an epoxy coating 164 is applied so to protect the top layer ceramic circuitry (a conformal coating). Heat spreader 164 is attached to the back side of chip 150 using a flexible-epoxy 166. Improved mechanical strenth may be obtained for heat spreaders that have a footprint much larger than the chip, by bonding the heat spreader to the conformal coating at 168 with the flexible-epoxy or a typical epoxy.

The CTE of Si is about 2.6 ppm/° C. and the CTE of the Al of the heat spreader is about 23.6 ppm/° C. which results in a CTE difference of 21 ppm/° C. The back of the chip is very smooth resulting in a weak mechanical bond and any de-lamination or cracking of the epoxy between the chip and heat spreader causes a critical reduction in heat transfer from the chip. When this structure is subjected to thermal cycling common epoxies quickly fail (de-laminate). Silicone based adhesives have Tg's below 25° C. and Young's Module below 20,000 psi. However, mechanically, the bonds are about one third to one half the strength of a flexible epoxy. Also, constituents of silicone adhesives have a tendency to migrate out contaminating surfaces with a thin coating. The applicants have discovered that flexible-epoxies (e.g. ABLEBOND pi-8971 and EG 7655) meet the thermal cycling requirements of this test.

Leads 156 of module 148 are attached to conductive pads 170 (preferably copper) of substrate 156 (a fiberglass-epoxy circuit board or flexible circuit board of laminated copper and polyimide films).

Figure 3:
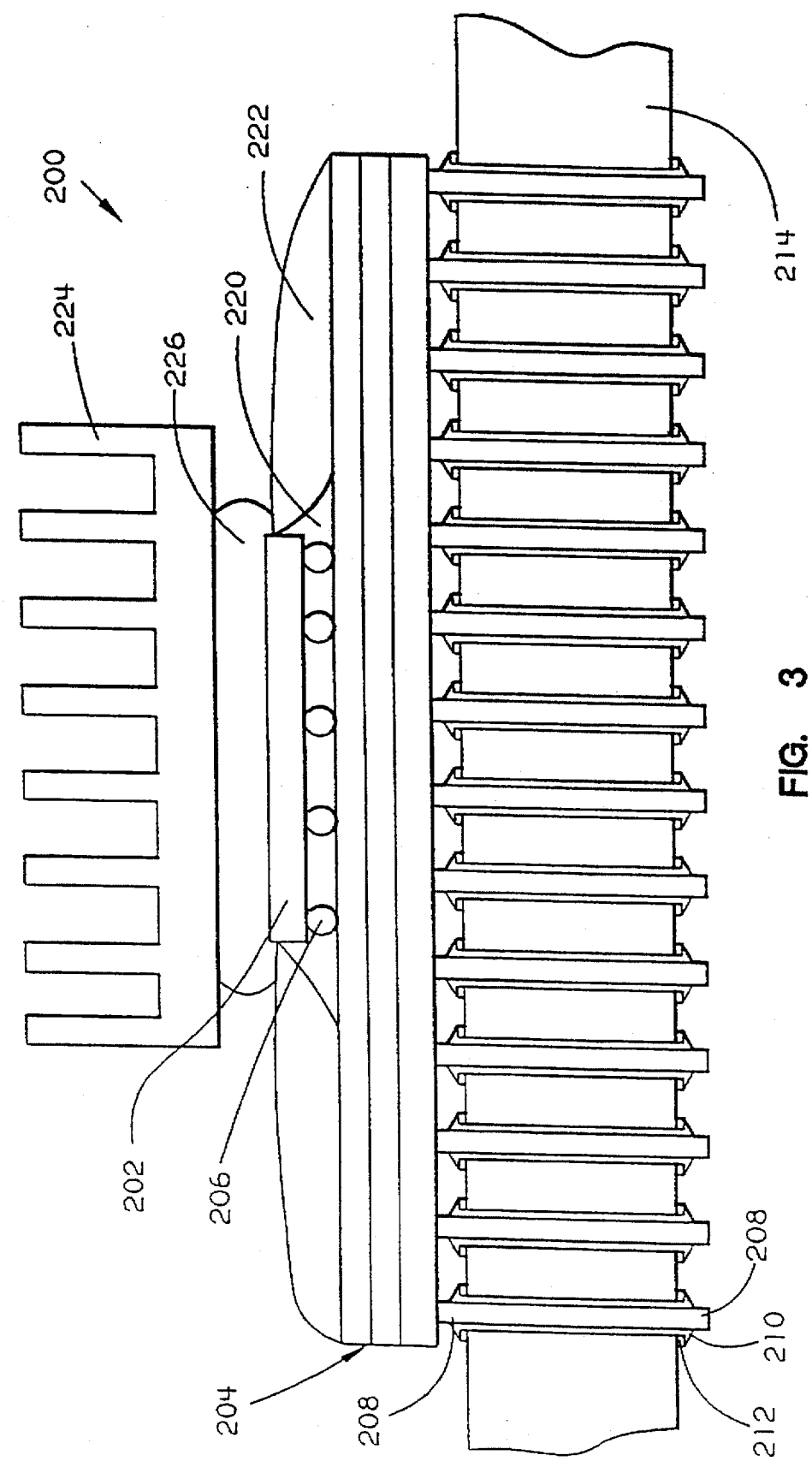
FIG. 3 shows an aluminum heat spreader bonded by flexible-epoxy to a semiconductor flip-chip on a CPGA to illustrate another embodiment of the invention.

FIG. 3 shows a CPGA (ceramic pin grid array module) 200. The front side (bottom) of a semiconductor flip-chip die 202 is attached to a rectangular ceramic chip carrier 204 (single or multi-layer as shown) by a perimeter row or grid array of joints 206 (preferably C4 or ECA). A matrix of pins 208 are wave soldered 210 to copper pads 212 on both end of PTHs (plated-through-holes) extending through substrate 214 (e.g. fiberglass epoxy or flexible laminate of copper-polyimide films). Joints 206 are encapsulated with epoxy 220 and a conformal coating of epoxy 222 may be deposited on the surface of substrate 204. Heat spreader 224 is attached to the back side of chip 202 using flexible-epoxy 226.

Figure 4:
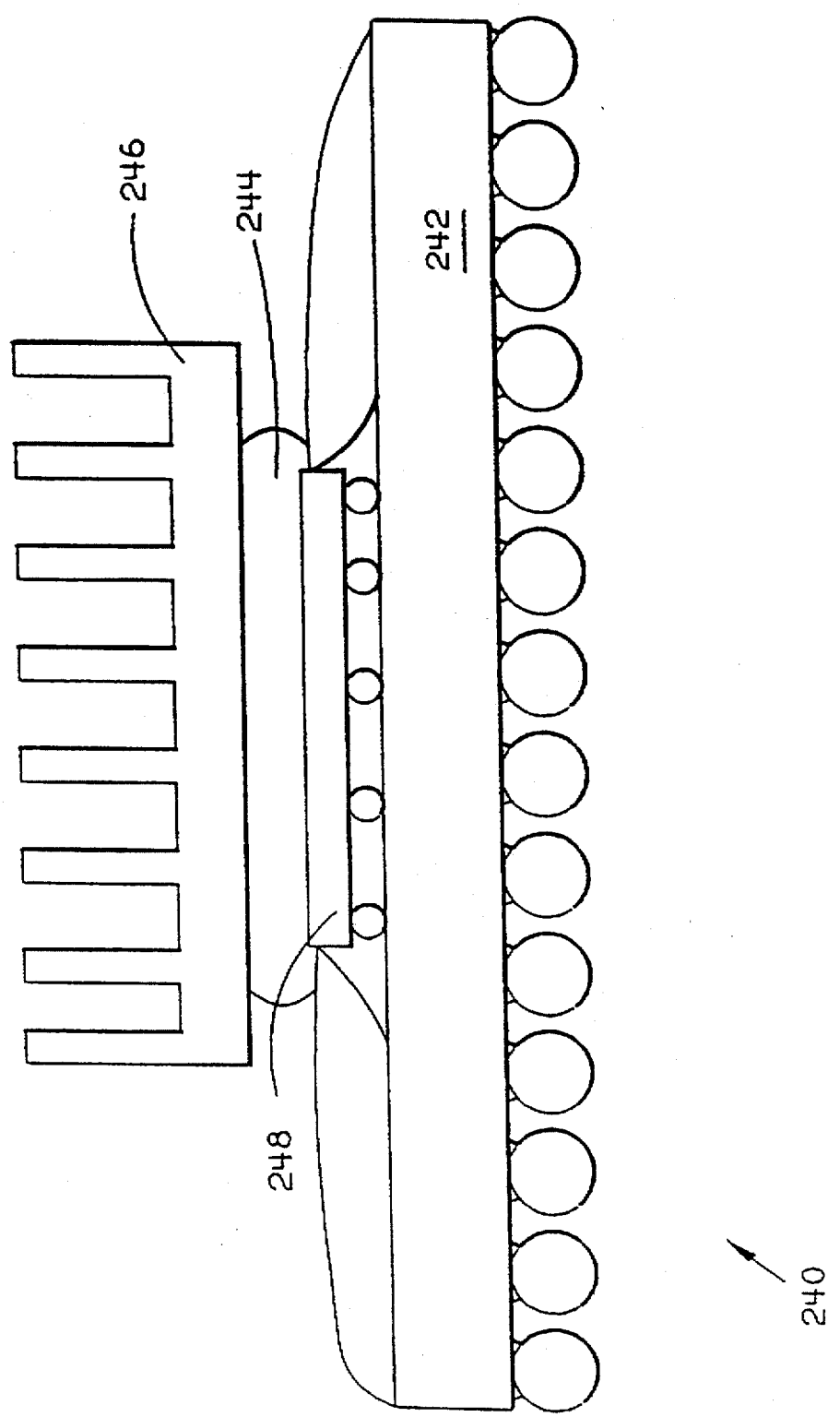
FIG. 4 shows another embodiment of the invention similar to FIG. 3 and in which an aluminum heat spreader is bonded to a semiconductor flip-chip by flexible-epoxy to a CBGA or PBGA.

FIG. 4 shows a BGA (ball grid array) module 240 which is similar to the CPGA of FIG. 3. Substrate 242 may be ceramic (CBGA) or plastic (PBGA) and may be one or multi-layer. Again, flexible-epoxy 244 is used to attach heat sink 246 to flip-chip 248.

Figure 5:
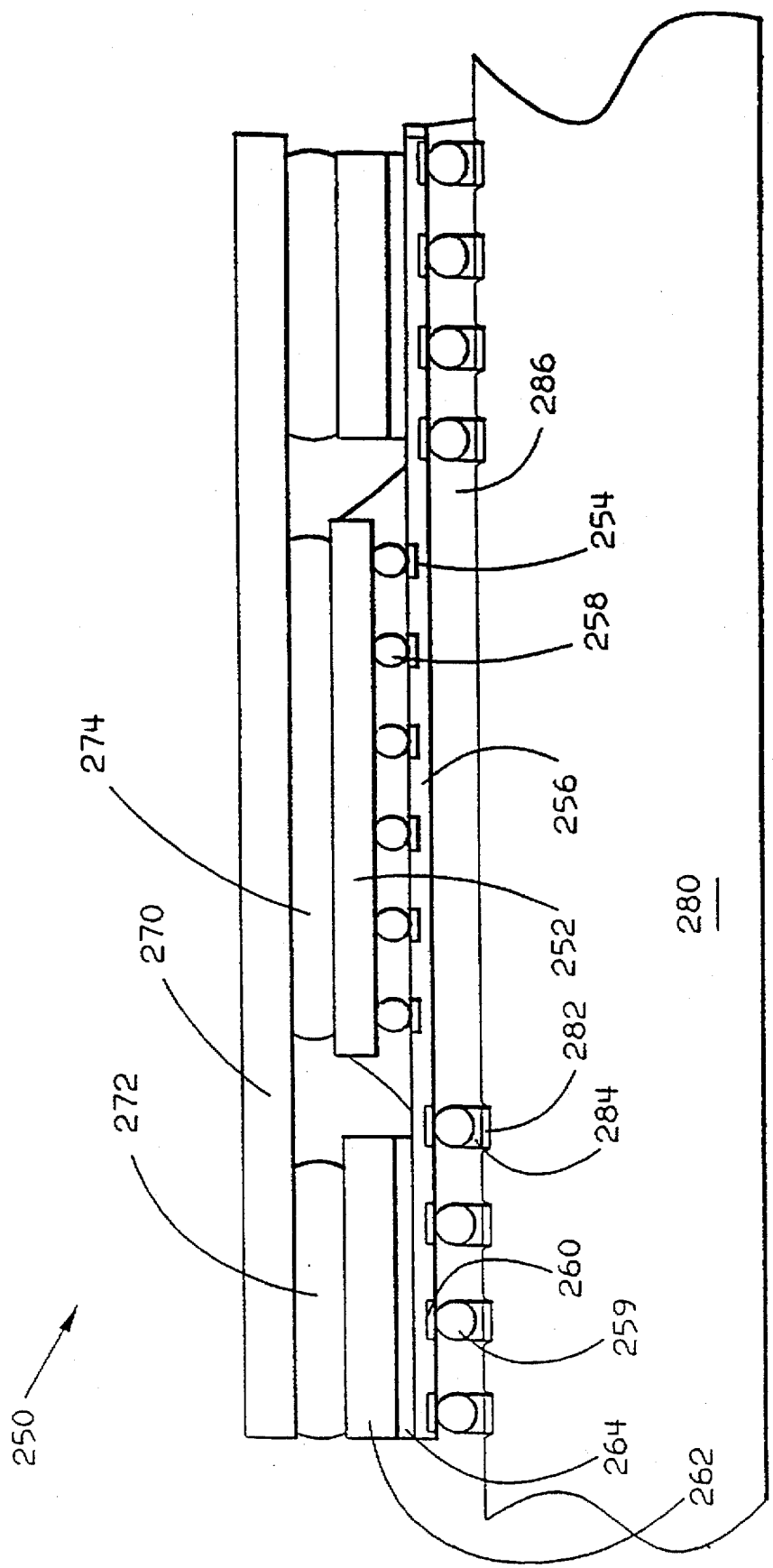
FIG. 5 shows a copper heat spreader plate bonded by flexible-epoxy to a semiconductor chip on a tape ball grid array package to illustrate another embodiment of the invention.

FIG. 5 shows TBGA module 250. The bottom of flip-chip 252 is attached to copper pads 254 of a flexible chip carrier substrate 256 (a laminate typically of one or more patterned copper layers and polyimide sheets) by joints 258 made by C4, thermal compression bonding, or laser welding or by the SATT (solder attach tape technology). Solder balls 258 (preferably 90/10% Pb/Sn) are attached to copper pads 260 of the flexible tape 256 by laser welding, thermal compression bonding, or by depositing eutectic solder on the pads and reflowing with the balls in place. Rectangular metal frame 262 such as Al or preferably Cu plated by nickle (Ni), is attached to the flex substrate by adhesive 264 (preferably epoxy). Heat spreader 270 is attached to frame 262 by adhesive 272 (preferably epoxy) and is attached to chip 252 by flexible-epoxy 274. The heat spreader may be Al treated by Anodization or chromate conversion or preferrably is Cu coated with Ni.

Module 250 is attached to substrate 280 (such as fiberglass epoxy or a flexible laminate described above) by depositing solder paste (preferably 37/63% Pb/Sn) on copper pads 282, placing the module on the substrate with the solder balls on the paste, and heating the structure until the paste becomes molten to form joints of solder 284. Alternately, balls 258 and solder 284 may be replaced by an ECA encapsulated by a thermoplastic or thermoset 286, and which is attached to pads 282 by heat and pressure.

The CTE of Si is about 2.6 ppm/° C. and the CTE of the Cu of the heat spreader is about 17 ppm/° C. which results in a CTE difference of 14.4 ppm/° C. Again, the back of the chip is very smooth resulting in a weak mechanical bond and any de-lamination or cracking of the epoxy between the chip and heat spreader causes a critical reduction in heat transfer from the chip. When this structure is subjected to thermal cycling common epoxies quickly fail (de-laminate). Si based adhesives also delaminate during a thermal cycling test consisting of 0° to 100° C. for 1,500 cycles, then −25° to 125° C. for 400 cycles, then −40° to 140° C. for 300 cycles required to prove the reliability of joints between these materials. The applicants have discovered that flexible-epoxies (e.g. ABLEBOND 8971 and EG 7655) reliably meet the thermal cycling requirements of this test.

Figure 6:
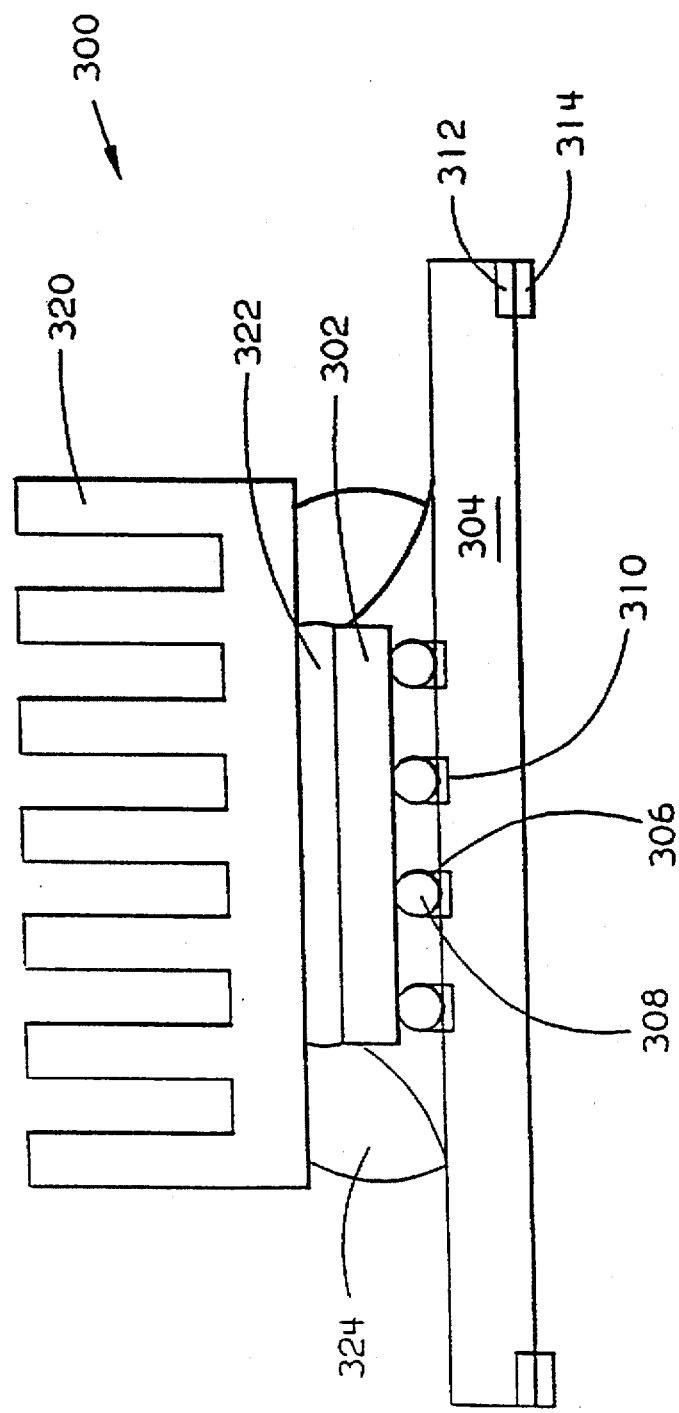
FIG. 6 shows an aluminum heat spreader bonded by flexible-epoxy to a semiconductor chip on a direct chip attachment organic carrier to illustrate another embodiment of the invention.

FIG. 6 shows a DCAM module 300. Flip-chip 302 is attached to a multi-layer fiberglass epoxy substrate 304. Eutectic solder 306 is deposited (by HASL, solder-on-chip, solder inject, by transfer from a stainless steel decal) to connect between high temperature solder bumps 308 on the bottom of the chip and copper pads 310 on the top surface of the substrate. Copper pads 312 are positioned to connect to copper pads on a interconnect structure (organic circuit board as in FIGS. 2 and 5). Solder 314 may be provided on pads 312 for reflow soldered attachment. Heat spreader 320 is attached to the back side of chip 302 using an flexible-epoxy 322. Improved mechanical strenth can be obtained for heat spreaders which extend significantly past the limits of the chip by encapsulating between the heat spreader at 324 and substrate 304 using flexible-epoxy or another well known epoxy.

Figure 7:
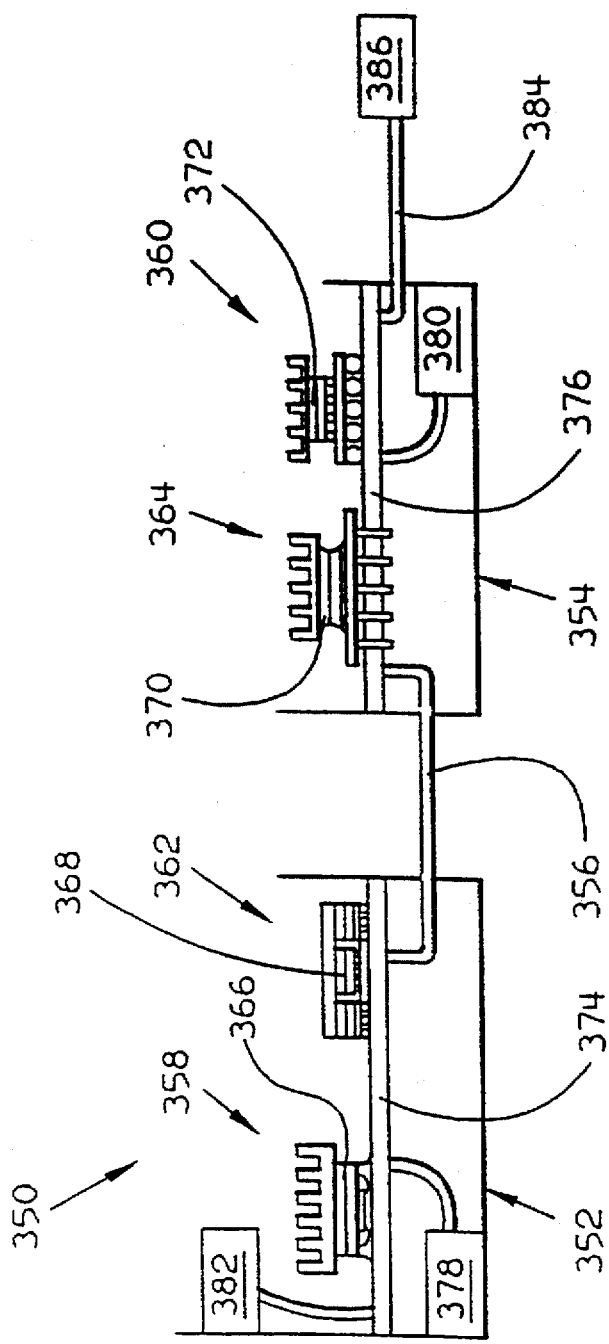
FIG. 7 shows the information handling system of the invention which is enhanced by the thermal perfomance provided by bonding heat spreaders to A/N ceramic and/or silicon surfaces of high power density components using flexible-epoxy.

FIG. 7 shows a computer network embodiment of the information handling system 350 of the invention. Computer systems 352 and 354 are networked together by optic or electrical signal cable 356. Systems 352 and 354 have CPU (central processor unit) modules 358, 360 and memory modules 362 and 364 respectively. The modules use flexible-epoxy 366–372 to attach heat sinks to the modules to allow operation at higher power so that the performance of the entire information handling system is enhanced. The modules in each system are attached to one or more electrical interconnect structures 374, 376. The interconnect structures are connected to power supplies 378, 380 such as batteries, transformers, or power cords, and may be connected to other computer devices 382 such as disk drives, other interconnect structures. One or more optic or electrical cables 384 or cable connectors is attached to the interconnect structures to provide for data input and output with computer peripherals 386 such as keyboards, CRTs, modems, sensors, motors, etc..

Although not shown, these inventions include multi-chip modules having individual heat spreaders on one or multiple chips and/or common heat spreaders each for a plurality of the chips on such a module or even common heat spreaders for multiple modules.

While the invention has been described with reference to preferred embodiments of apparatus and methods it will be understood by those skilled in the art that changes may be made without departing from the spirit and scope of the invention which is only limited by the claims.

What is claimed is:

1. A chip carrier module, comprising:

a first organic substrate;

a semiconductor chip connected to the first substrate;

a layer of flexible-epoxy having a Young's modulus of less than 100,000 psi at 25° C. on a first surface of the chip;

a heat spreader with a surface bonded to the first surface of the chip by the flexible-epoxy;

means for mechanically holding the heat spreader and chip in a fixed position relative to the first substrate; and means for connecting the first substrate to another substrate.

2. The module of claim 1 in which the flexible-epoxy has a glass transition temperature of less than 25° C.

3. The module of claim 1 in which the flexible-epoxy has a glass transition temperature of less than 10° C.

4. The module of claim 1 in which the flexible-epoxy has a glass transition temperature of less than 0° C.

5. The module of claim 1 in which the flexible-epoxy has a Young's modules of less than 50,000 psi at 25° C.

6. The module of claim 1 in which the flexible-epoxy has a Young's modules of less than 20,000 psi at 25° C.

7. The module of claim 1 in which the flexible-epoxy has a Young's modules of less than 10,000 psi at 25° C.

8. The module of claim 1, in which the heat spreader includes an aluminum base.

9. The module of claim 8 in which the heat spreader surface has an anodize aluminum coating.

10. The module of claim 8 in which the heat spreader comprises aluminum coated by a chromate conversion.

11. The module of claim 1 in which the heat spreader includes copper.

12. The module of claim 11 in which the heat spreader surface includes a Ni coating over the copper.

13. A chip carrier module, comprising:

a first substrate;

a semiconductor chip positioned on a first side of the first substrate;

a layer of flexible-epoxy having a Young's modulus of less than 100,000 psi at 25° C. positioned on a second side of the first substrate;

a heat spreader with one surface bonded to the second side of the first substrate;

means for mechanically holding the heat spreader, chip, and first substrate in a fixed relative position; and means for electrically connecting the chip to a second substrate.

14. The module of claim 13 in which the first substrate comprises a ceramic material.

15. The module of claim 13 in which means for mechanically holding the heat spreader and chip in a fixed position relative to the first substrate include, bonding the chip to the first side of the first substrate.

16. The module of claim 13 in which means for mechanically holding the heat spreader and chip in a fixed position relative to the first substrate include:

bonding the chip to a first side of said second substrate; and bonding the first side of the second substrate to the first side of the first substrate to enclose the chip between the substrates.

17. The module of claim 13 in which the flexible-epoxy has a glass transition temperature of less than 25° C.

18. A flip chip package, comprising:

a first substrate with an area array of metal contacts on a first substrate surface and means for connection to a second substrate;

a semiconductor flip chip with a first chip surface parallel to the first substrate surface and having an area array of metal contacts on the first chip surface matching and confronting respective contacts of the area array of the first substrate;

electrical conductors extending between respective contacts of the first substrate and chip;

a layer of flexible-epoxy having a Young's modulus of less than 100,000 psi at 25° C. on a second surface of the chip; and a heat spreader with an aluminum surface bonded to the chip by the flexible-epoxy.

19. The package of claim 18 in which the flexible-epoxy has a glass transition temperature of less than 25° C.

20. An interconnect structure, comprising:

a first organic substrate with metal contacts;

a semiconductor chip with metal contacts on a first surface;

conductors electrically connecting said metal contacts of the first substrate and contacts of the chip;

a layer of flexible-epoxy having a Young's modulus of less than 100,000 psi at 25° C. on a second surface of the chip;

a heat spreader with one surface bonded to the first surface of the chip by the flexible-epoxy;

means for mechanically holding the heat spreader, chip, and first substrate in a fixed relative position; and a second substrate electrically and mechanically connected to the first substrate.

21. The structure of claim 20 in which the flexible-epoxy has a glass transition temperature of less than 25° C.

22. An information handling system, comprising:

a first organic substrate with metal contacts;

a semiconductor chip of a central processing unit with metal contacts on a first surface;

conductors electrically connecting said metal contacts of the first substrate and contacts of the chip;

a layer of flexible-epoxy having a Young's modulus of less than 100,000 psi at 25° C. on a second surface of the chip;

a heat spreader with one surface bonded to the first surface of the chip by the flexible-epoxy;

means for mechanically holding the heat spreader, chip, and first substrate in a fixed relative position; and a second substrate electrically and mechanically connected to the first substrate;

memory means electrically connected to the chip of the central processing unit;

power supply means connected to the second substrate; and input/output means connected to the second substrate.

23. The structure of claim 22 in which the flexible-epoxy has a glass transition temperature of less than 25° C.

24. A chip carrier module, comprising:

a first substrate;

a semiconductor chip electrically connected to the first substrate;

a layer of flexible-epoxy having a Young's modulus of less than 100,000 psi at 25° C. on a first surface of the chip;

a heat spreader with an aluminum surface bonded to the first surface of the chip by the flexible epoxy;

means for mechanically holding the heat spreader and chip in a fixed position relative the first substrate; and means for connecting the first substrate to another substrate.

25. A chip carrier module, comprising:

a first substrate;

a semiconductor chip electrically connected to the first substrate;

a layer of flexible-epoxy having a Young's modulus of less than 100,000 psi at 25° C. on a first surface of the chip;

a heat spreader including copper metal bonded to the first surface of the chip by the flexible epoxy;

means for mechanically holding the heat spreader and chip in a fixed position relative the first substrate; and means for connecting the first substrate to another substrate.

26. A chip carrier module, comprising:

a first substrate;

a semiconductor chip electrically connected to the first substrate;

a layer of flexible-epoxy having a Young's modulus of less than 100,000 psi at 25° C. on a first surface of the chip;

a heat spreader with a surface bonded to the first surface of the chip by the flexible epoxy;

means for mechanically holding the heat spreader and chip in a fixed position relative the first substrate; and peripheral J-leads for connecting the first substrate to another substrate.

27. A chip carrier module, comprising:

a first substrate;

a semiconductor chip electrically connected to the first substrate;

a conformal coating covering the first substrate up to the height of an extension of chip from the substrate;

a layer of flexible-epoxy having a Young's modulus of less than 100,000 psi at 25° C. on a first surface of the chip;

a heat spreader with an aluminum surface bonded to the first surface of the chip by the flexible epoxy;

means for mechanically holding the heat spreader and chip in a fixed position relative the first substrate; and means for connecting the first substrate to another substrate.

28. A chip carrier module, comprising:

a first substrate;

a semiconductor chip mechanically bonded to the first substrate;

a second substrate mechanically bonded to the first substrate to form an enclosure containing the chip;

a layer of flexible-epoxy having a Young's modulus of less than 100,000 psi at 25° C. on a first surface of the enclosure;

a heat spreader bonded to the enclosure by the flexible epoxy.

29. A chip carrier module, comprising:

a first substrate with multiple wiring layers and conductive vias extending between wiring layers and two wiring layers including first connectors for attaching a semiconductor chip and second connectors for attaching the first substrate to another substrate;

a semiconductor chip electrically connected to the first connectors of the first substrate;

a layer of flexible-epoxy having a Young's modulus of less than 100,000 psi at 25° C. on a first surface of the chip;

a heat spreader with an aluminum surface bonded to the first surface of the chip by the flexible epoxy; and means for mechanically holding the heat spreader and chip in a fixed position relative the first substrate.

30. The chip carrier of claim 29, in which the second connectors include bumps or balls of high melting temperature solder for attaching to another substrate.

31. The chip carrier of claim 29, in which the second connectors include a low temperature solder at the distal ends of the connectors for low temperature attachment to another substrate.

32. The chip carrier of claim 29, in which the semiconductor chip is a flip-chip and the first connectors include an area array of bumps connecting the flip chip to the first substrate.

33. A chip carrier module, comprising:

a first substrate;

a semiconductor chip electrically connected to the first substrate;

a layer of flexible-epoxy having a Young's modulus of less than 100,000 psi at 25° C. on a first surface of the chip;

a heat spreader with an aluminum surface bonded to the first surface of the chip by the flexible epoxy;

means for mechanically holding the heat spreader and chip in a fixed position relative the first substrate; and connection pins for connecting the first substrate to a pin socket or to another substrate with plated through holes.

34. A chip carrier module, comprising:

a first substrate;

a semiconductor chip electrically connected to the first substrate;

a layer of flexible-epoxy having a Young's modulus of less than 100,000 psi at 25° C. on a first surface of the chip;

a heat spreader with a surface bonded to the first surface of the chip by the flexible epoxy;

means for mechanically holding the heat spreader and chip in a fixed position relative the first substrate; and an area array of connectors of round cross-section connecting the first substrate to another substrate.

* * * * *